(12) United States Patent
Merckling et al.

(10) Patent No.: US 10,930,750 B2
(45) Date of Patent: Feb. 23, 2021

(54) METHOD FOR FORMING A QUBIT DEVICE

(71) Applicant: IMEC vzw, Leuven (BE)

(72) Inventors: Clement Merckling, Evere (BE);
Nadine Collaert, Blanden (BE)

(73) Assignee: IMEC vzw, Leuven (BE)

(*) Notice: Subject to any disclaimer, the term of this patent is extended or adjusted under 35 U.S.C. 154(b) by 88 days.

(21) Appl. No.: 16/222,911

(22) Filed: Dec. 17, 2018

(65) Prior Publication Data

US 2019/0214474 A1    Jul. 11, 2019

(30) Foreign Application Priority Data

Dec. 29, 2017  (EP) ..................................... 17211120

(51) Int. Cl.
*H01L 39/14* (2006.01)
*H01L 29/43* (2006.01)
(Continued)

(52) U.S. Cl.
CPC ............ *H01L 29/437* (2013.01); *B82Y 10/00* (2013.01); *G06N 10/00* (2019.01);
(Continued)

(58) Field of Classification Search
CPC ...... B82Y 10/00; G06N 10/00; G11C 13/025; G11C 2213/17; H01L 29/16;
(Continued)

(56) References Cited

U.S. PATENT DOCUMENTS 5,621,223 A * 4/1997 Nakamura ............ H01L 39/146
257/36
5,861,361 A * 1/1999 Nakamura ............ H01L 39/146
257/36
(Continued)

FOREIGN PATENT DOCUMENTS

WO    WO 2016/000836 A1    1/2016

OTHER PUBLICATIONS

Rokhinson et al., "The fractional a.c. Josephson effect in a semiconductor-superconductor nanowire as a signature of Majorana particles," Nature Physics, vol. 8, No. 11, Sep. 23, 2012, pp. 795-799.

(Continued)

*Primary Examiner* — Mary A Wilczewski
*Assistant Examiner* — Tsz K Chiu
(74) *Attorney, Agent, or Firm* — Knobbe Martens Olson & Bear, LLP

(57) ABSTRACT

The disclosed technology is directed to a method of forming a qubit device. In one aspect, the method comprises: forming a gate electrode embedded in an insulating layer formed on a substrate, wherein an upper surface of the substrate is formed from a group IV semiconductor material and the gate electrode extends along the substrate in a first horizontal direction; forming an aperture in the insulating layer, the aperture exposing a portion of the substrate; forming, in an epitaxial growth process, a semiconductor structure comprising a group III-V semiconductor substrate contact part (Continued)

and a group III-V semiconductor disc part, the substrate contact part having a bottom portion abutting the portion of the substrate and an upper portion protruding from the aperture above an upper surface of the insulating layer, the semiconductor disc part extending from the upper portion of the substrate contact part, horizontally along the upper surface of the insulating layer to overlap a portion of the gate electrode; forming a mask covering a portion of the disc part, the portion of the disc part extending across the portion of the gate electrode in a second horizontal direction; etching regions of the semiconductor structure exposed by the mask such that the masked portion of the disc part remains to form a channel structure extending across the portion of the gate electrode; and forming a superconductor source contact and a superconductor drain contact on the channel structure at opposite sides of the portion of the gate electrode.

14 Claims, 14 Drawing Sheets

(51) Int. Cl.
| | |
|---|---|
| H01L 29/06 | (2006.01) |
| H01L 29/08 | (2006.01) |
| H01L 29/66 | (2006.01) |
| H01L 29/423 | (2006.01) |
| B82Y 10/00 | (2011.01) |
| H01L 29/41 | (2006.01) |
| H01L 29/76 | (2006.01) |
| G06N 10/00 | (2019.01) |
| H01L 21/02 | (2006.01) |
| H01L 21/28 | (2006.01) |
| H01L 21/285 | (2006.01) |
| H01L 21/306 | (2006.01) |
| H01L 21/308 | (2006.01) |
| H01L 21/3205 | (2006.01) |
| H01L 29/417 | (2006.01) |
| H01L 29/786 | (2006.01) |

(52) U.S. Cl.
CPC .. *H01L 21/02546* (2013.01); *H01L 21/02549* (2013.01); *H01L 21/02603* (2013.01); *H01L 21/28264* (2013.01); *H01L 21/28575* (2013.01); *H01L 21/308* (2013.01); *H01L 21/30612* (2013.01); *H01L 21/32058* (2013.01); *H01L 29/0673* (2013.01); *H01L 29/0847* (2013.01); *H01L 29/413* (2013.01); *H01L 29/41733* (2013.01); *H01L 29/42356* (2013.01); *H01L 29/42384* (2013.01); *H01L 29/66522* (2013.01); *H01L 29/66742* (2013.01); *H01L 29/66977* (2013.01); *H01L 29/7613* (2013.01); *H01L 29/78681* (2013.01); *H01L 29/78696* (2013.01)

(58) Field of Classification Search
CPC ............ H01L 29/7613; H01L 51/0048; H01L 51/0508; H01L 51/0512; H01L 39/223; H01L 27/18; H01L 39/025; H01L 39/2493; H01L 39/045; H01L 39/228; H01L 39/2406; H01L 21/2018; H01L 21/02636–0265
See application file for complete search history.

(56) References Cited

U.S. PATENT DOCUMENTS

| | | | | |
|---|---|---|---|---|
| 6,979,836 | B2* | 12/2005 | Zagoskin | B82Y 10/00 257/31 |
| 7,385,262 | B2* | 6/2008 | O'Keeffe | B82Y 10/00 257/401 |
| 8,183,587 | B2* | 5/2012 | Samuelson | B82Y 10/00 257/98 |
| 9,437,614 | B1* | 9/2016 | Lee | H01L 21/02603 |
| 9,755,133 | B1* | 9/2017 | Nayfeh | G06N 10/00 |
| 10,490,727 | B2* | 11/2019 | Thomas | G06N 10/00 |
| 2003/0102470 | A1* | 6/2003 | Il'ichev | H01L 39/2496 257/31 |
| 2005/0064616 | A1 | 3/2005 | Jin et al. | |
| 2006/0033096 | A1* | 2/2006 | Astafiev | B82Y 10/00 257/14 |
| 2010/0276667 | A1* | 11/2010 | Kim | H01L 29/42332 257/24 |
| 2015/0053925 | A1* | 2/2015 | Liu | H01L 29/66439 257/24 |
| 2015/0097193 | A1* | 4/2015 | Yap | H01L 49/006 257/76 |
| 2016/0336177 | A1 | 11/2016 | Holland et al. | |
| 2017/0133576 | A1 | 5/2017 | Marcus et al. | |
| 2019/0164959 | A1* | 5/2019 | Thomas | H01L 39/223 |
| 2019/0393328 | A1* | 12/2019 | Leipold | H01L 29/66977 |

OTHER PUBLICATIONS

Roddaro et al., "InAs nanowire hot-electron Josephson transistor," arxiv.org, Cornell University Library, Mar. 10, 2010, Ithaca, NY, p. 1-6.

Mqurik, V. et al., "Signatures of Majorana Fermions in Hybrid Superconductor-Semiconductor Nanowire Devices," Science, vol. 366, No. 6084, May 25, 2012, pp. 1003-1007.

Extended Search Report in application EP21094131, EPO counterpart to this application, dated Jun. 19, 2018.

* cited by examiner

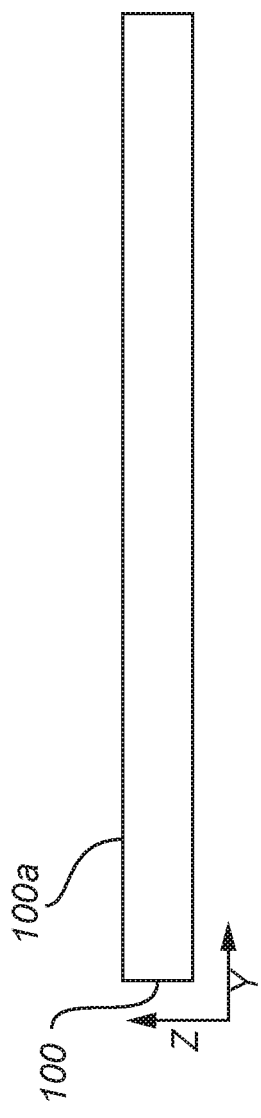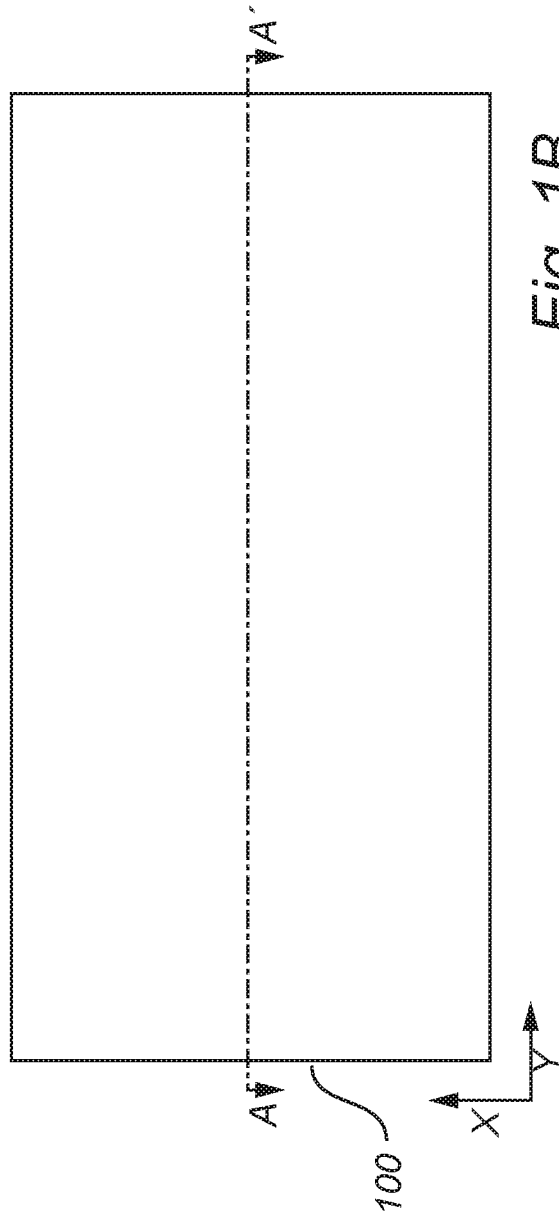

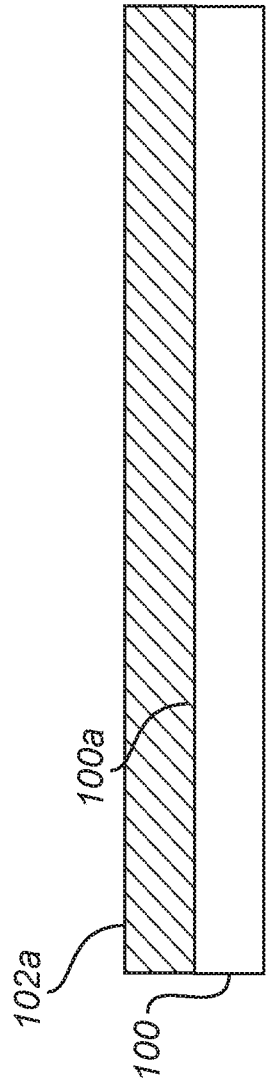
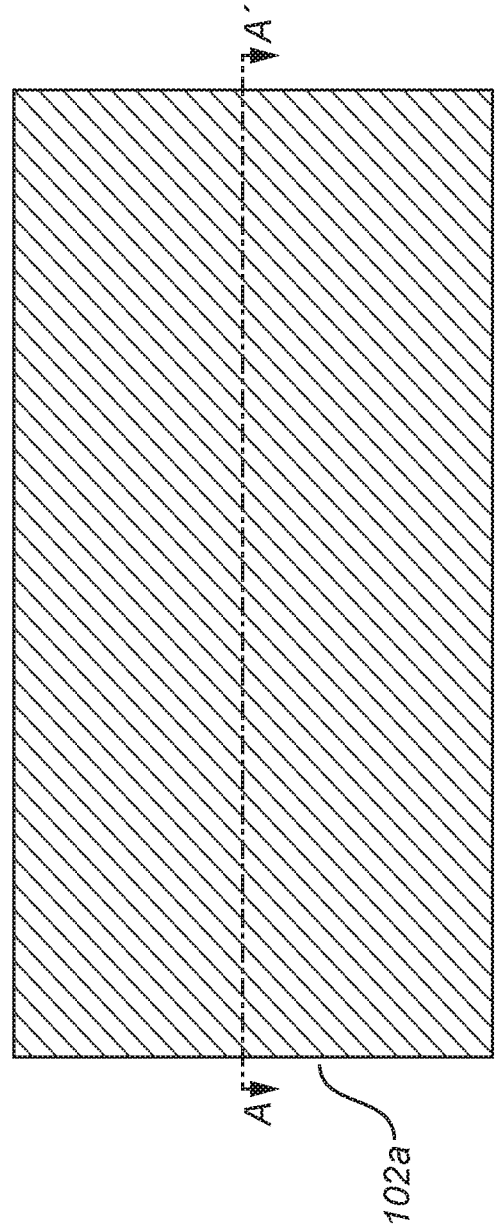

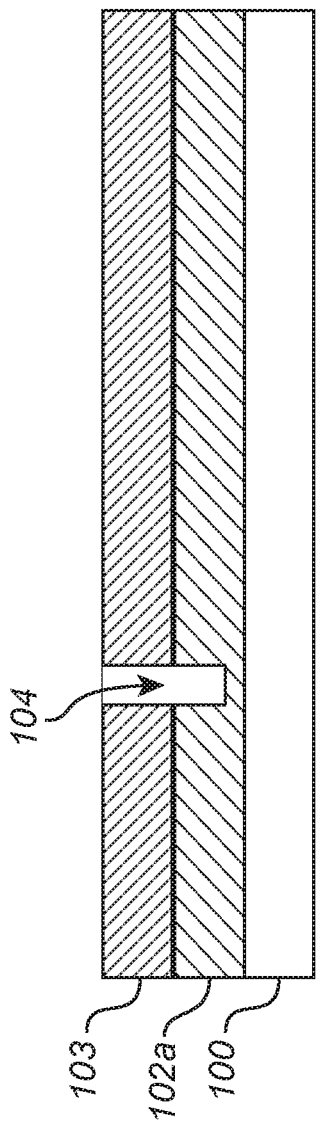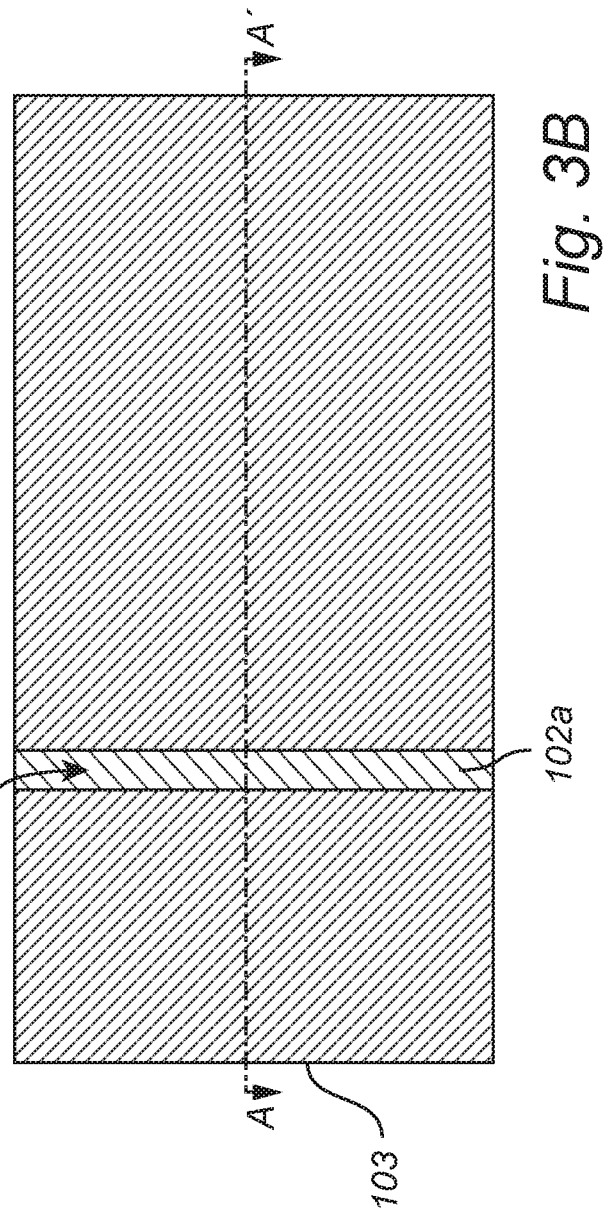

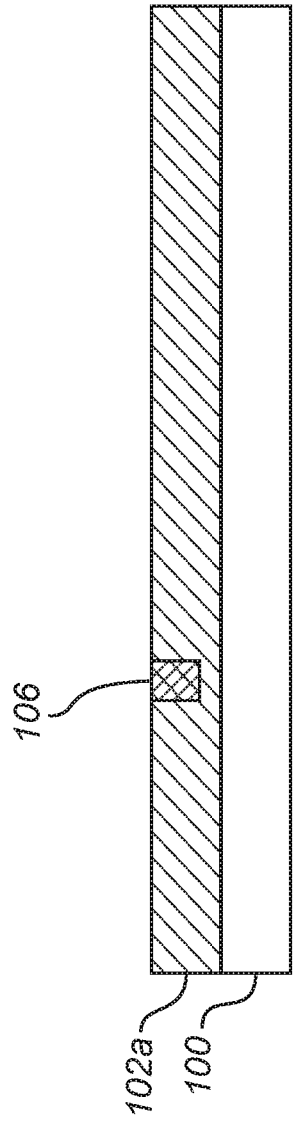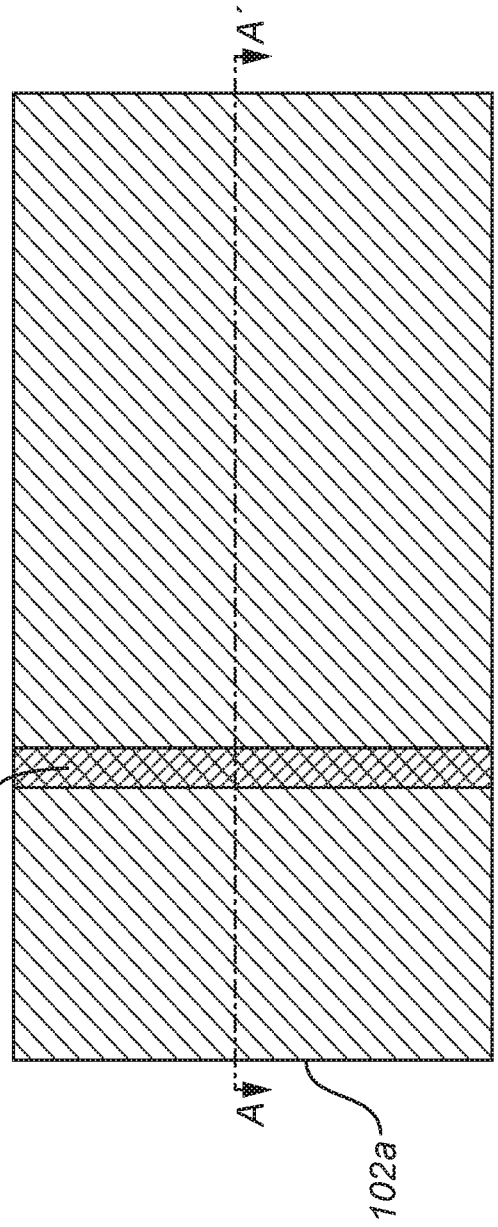

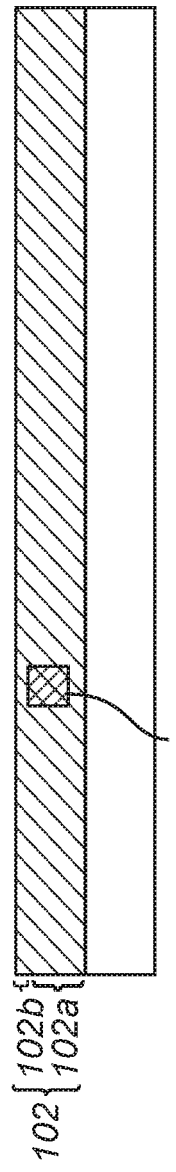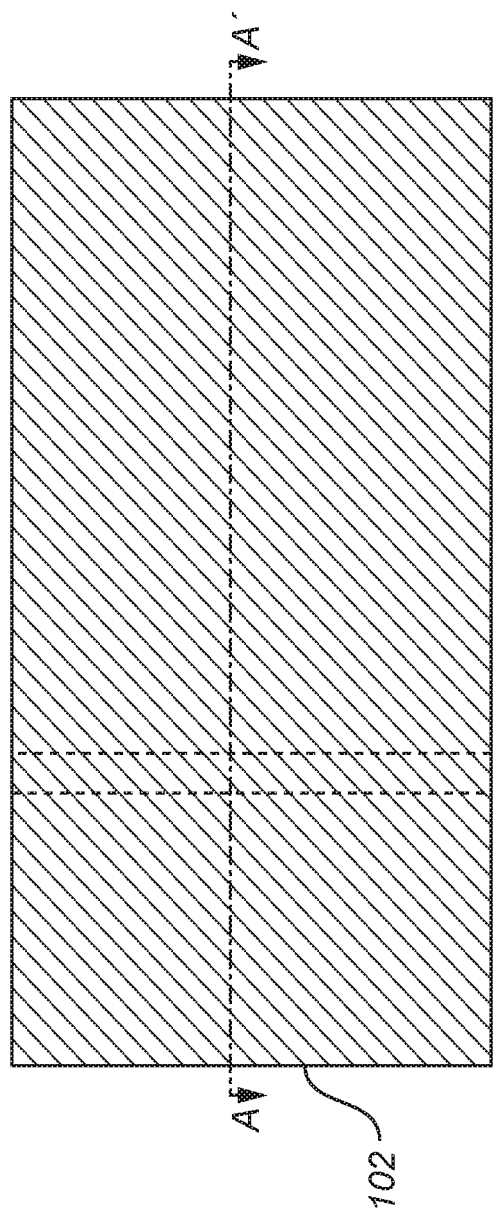

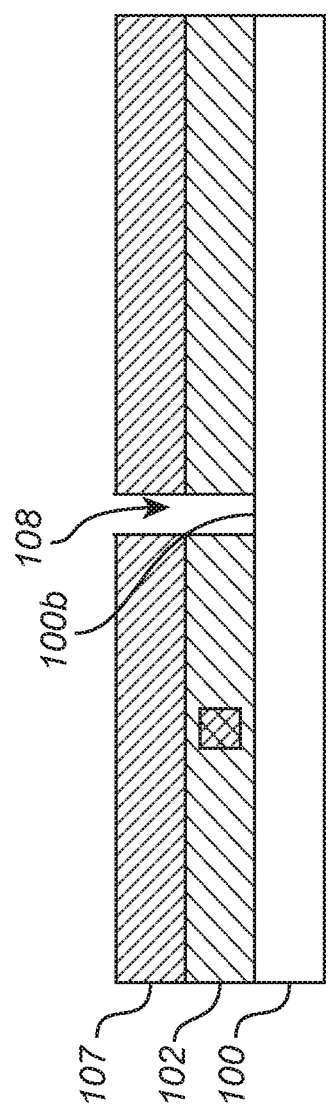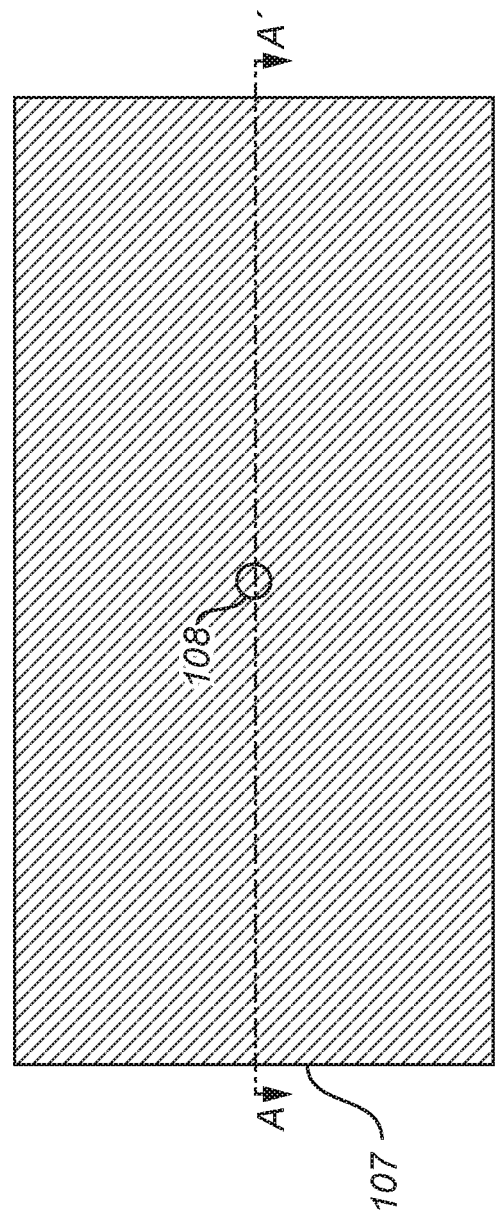

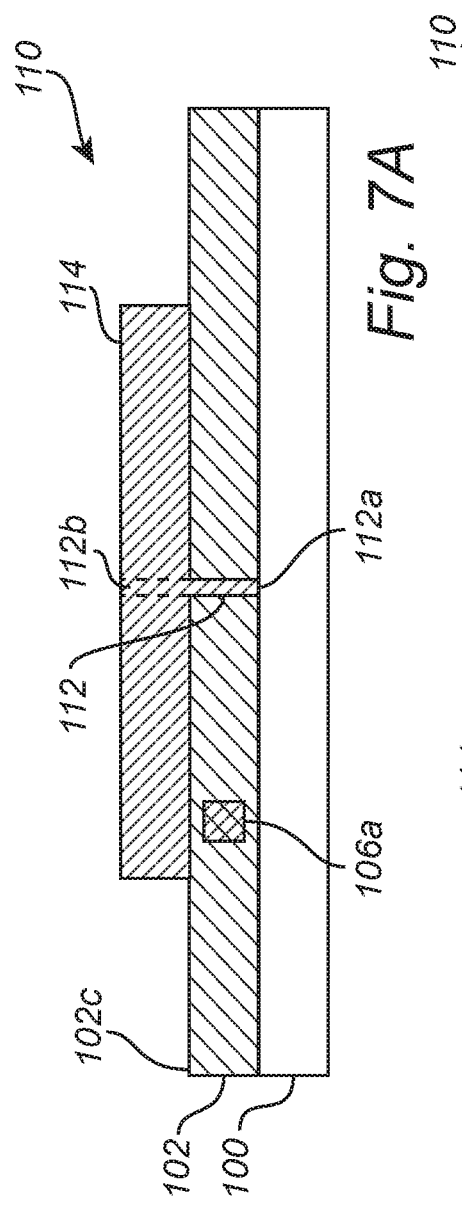
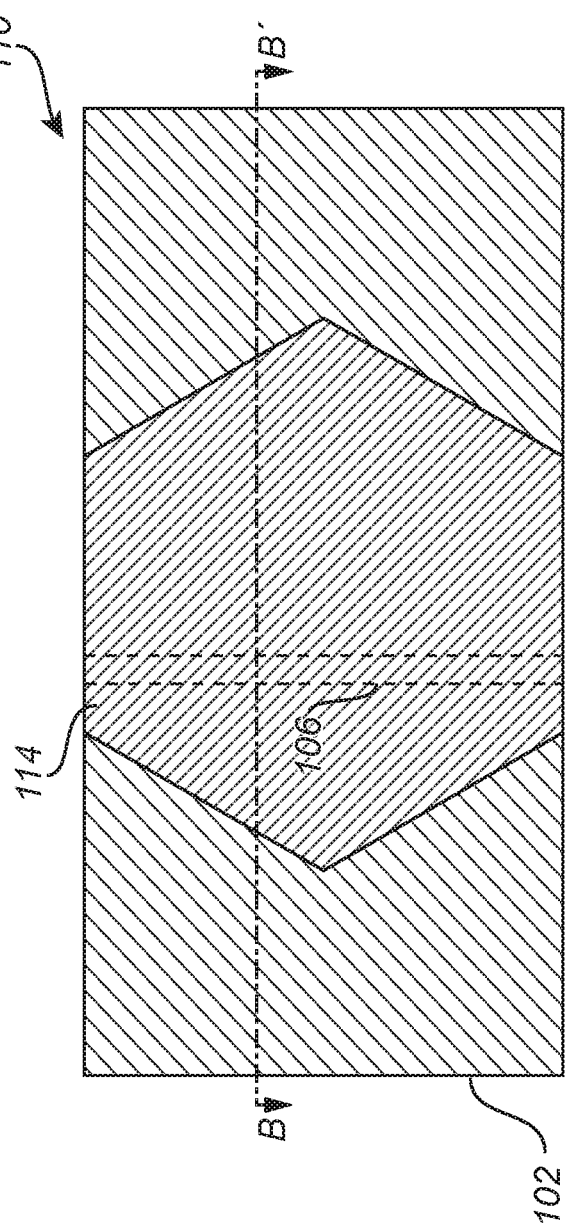

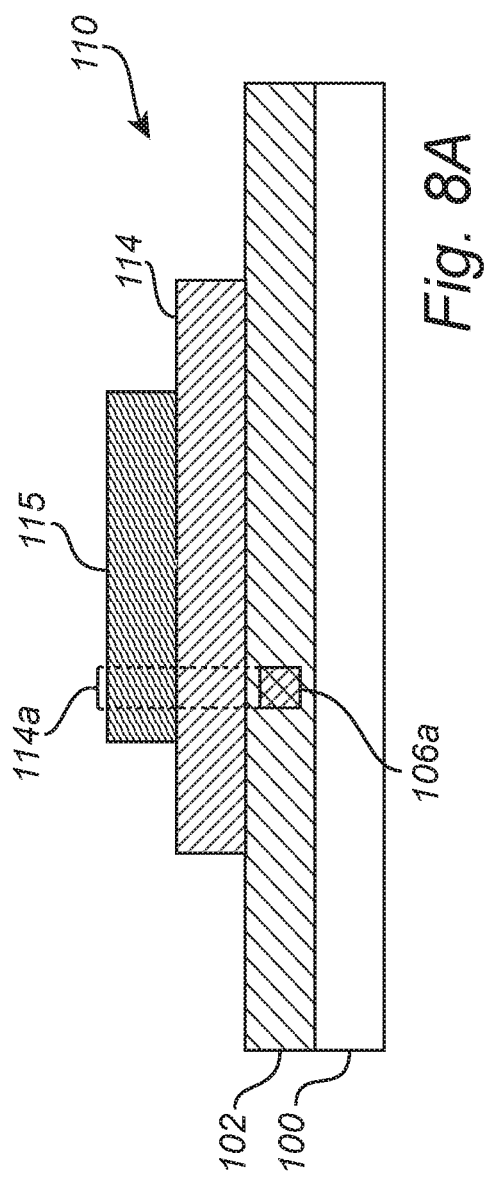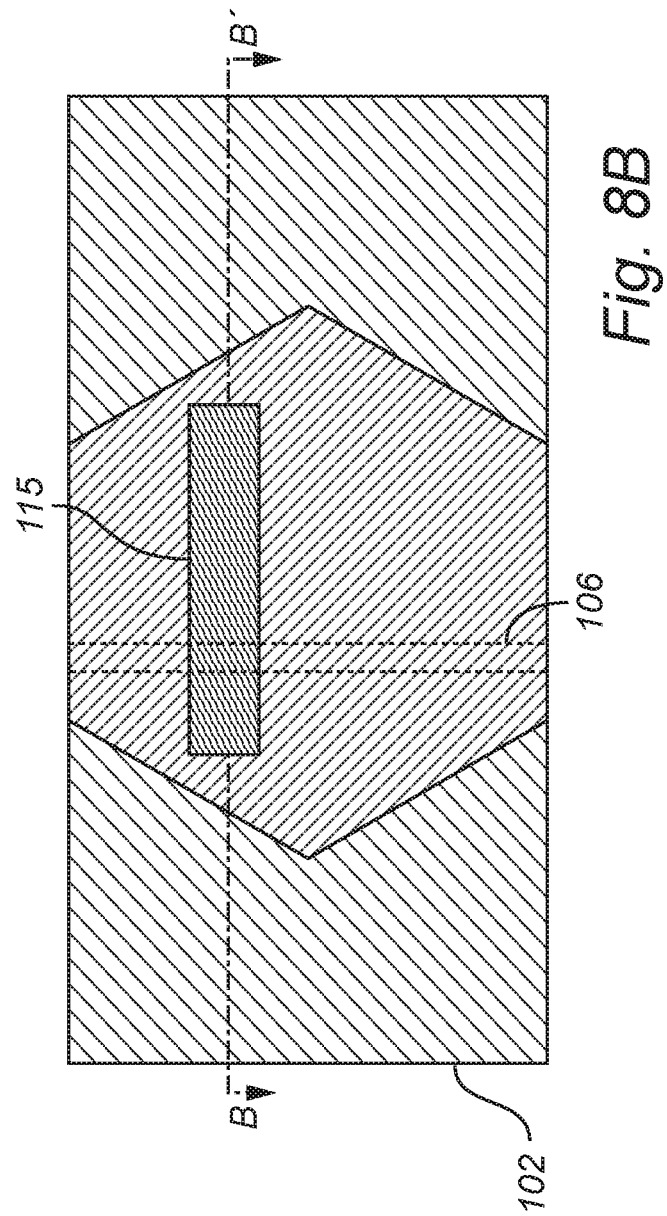

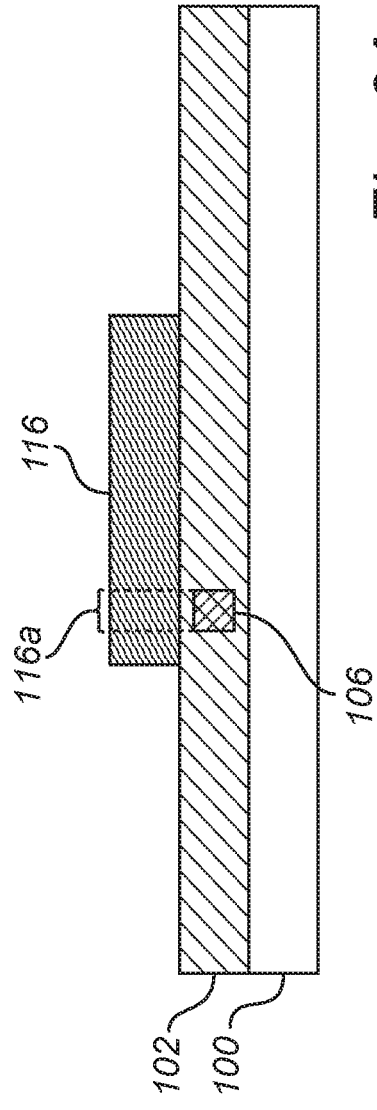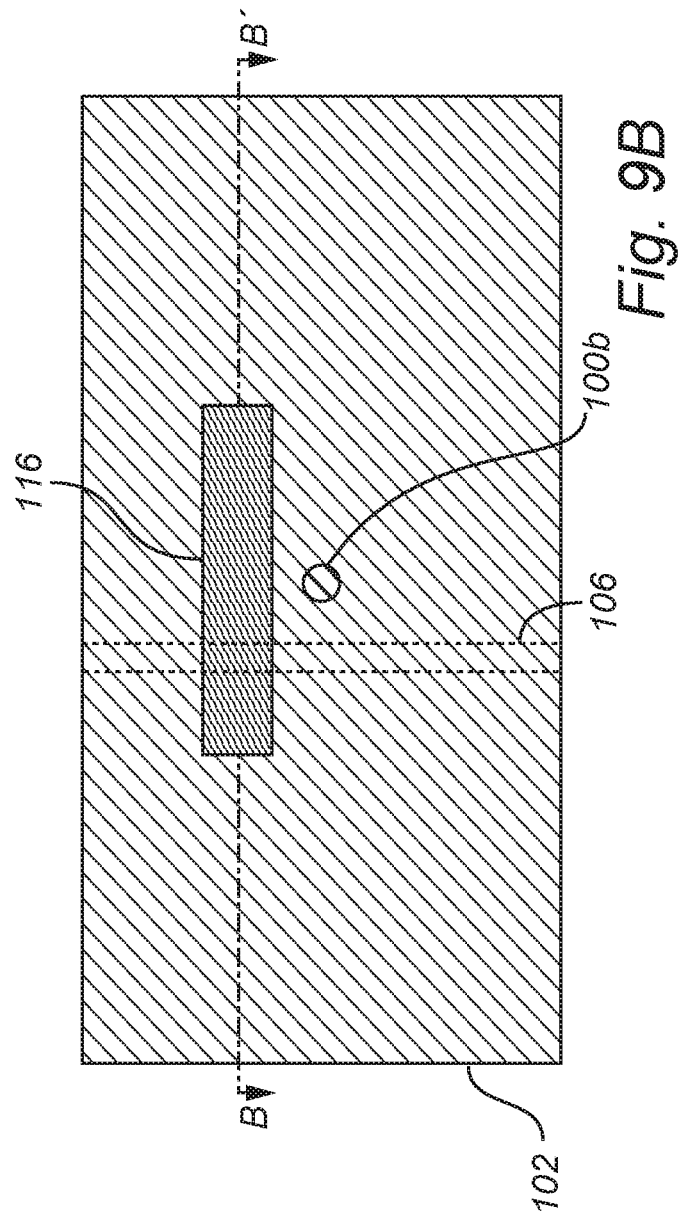

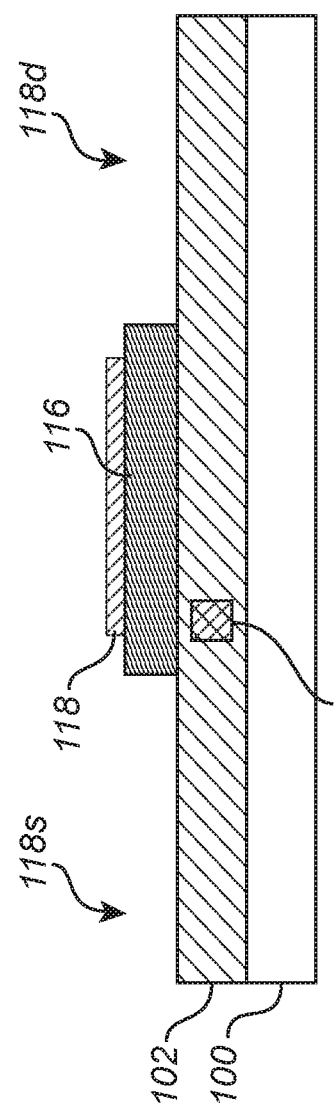
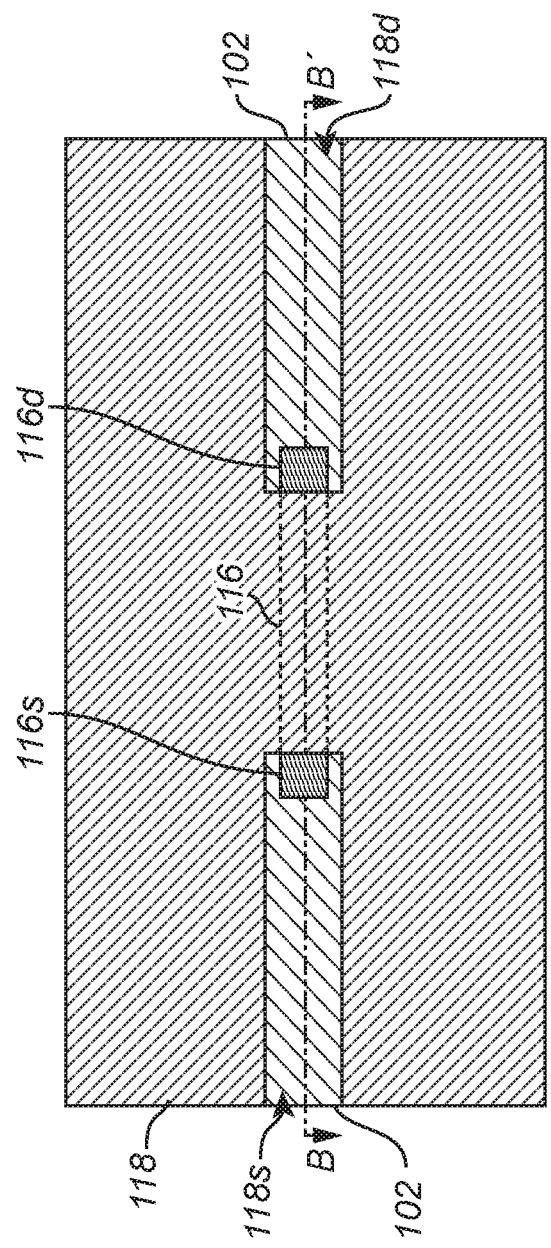

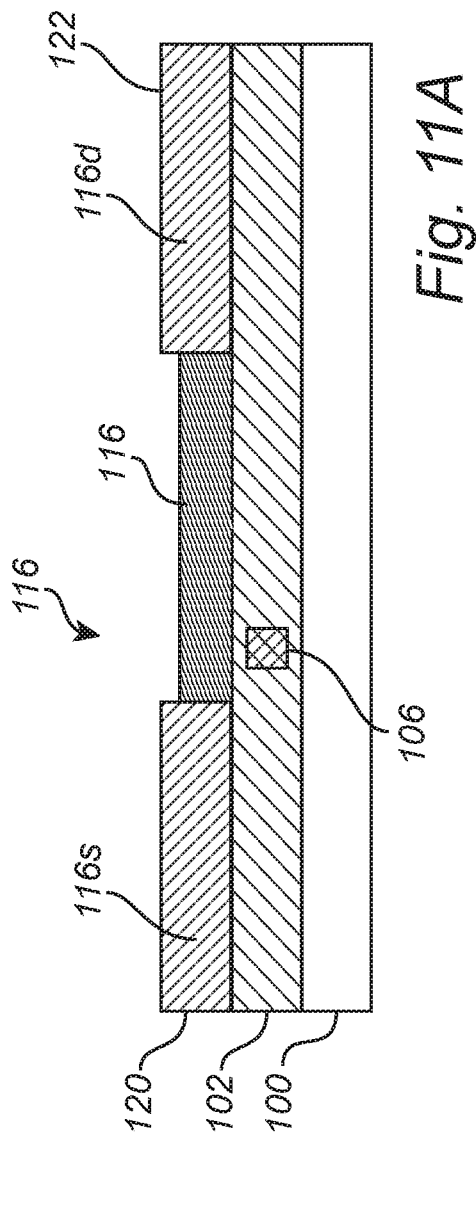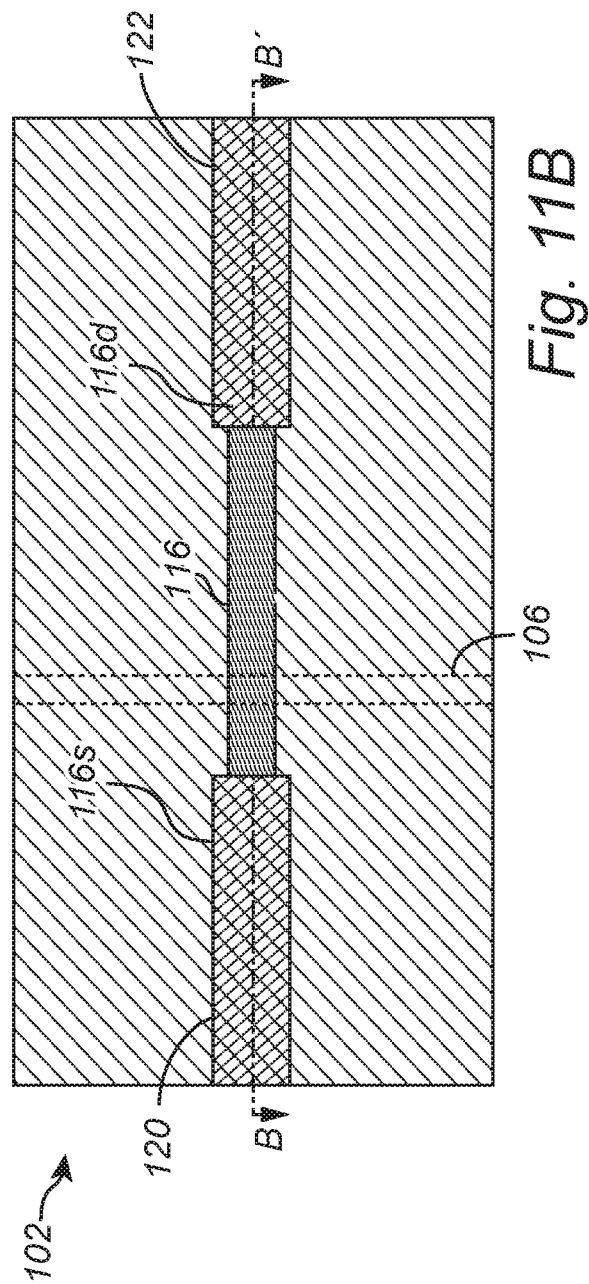

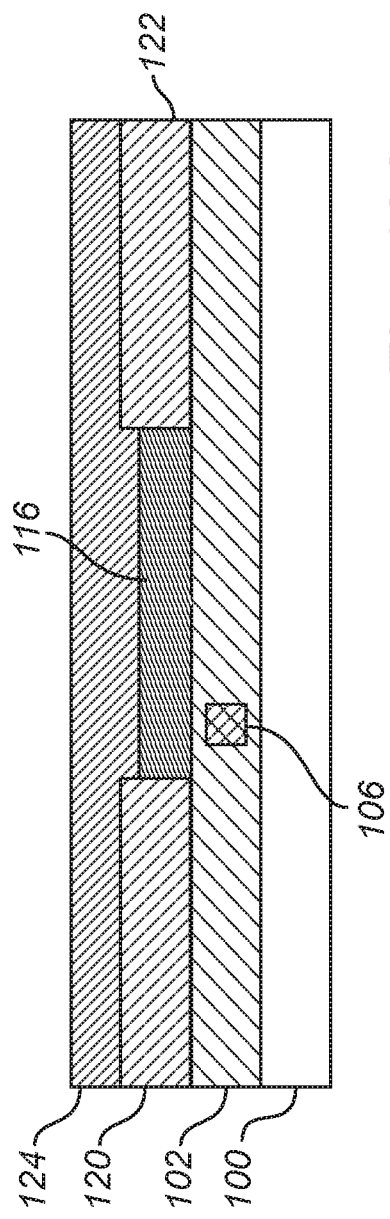
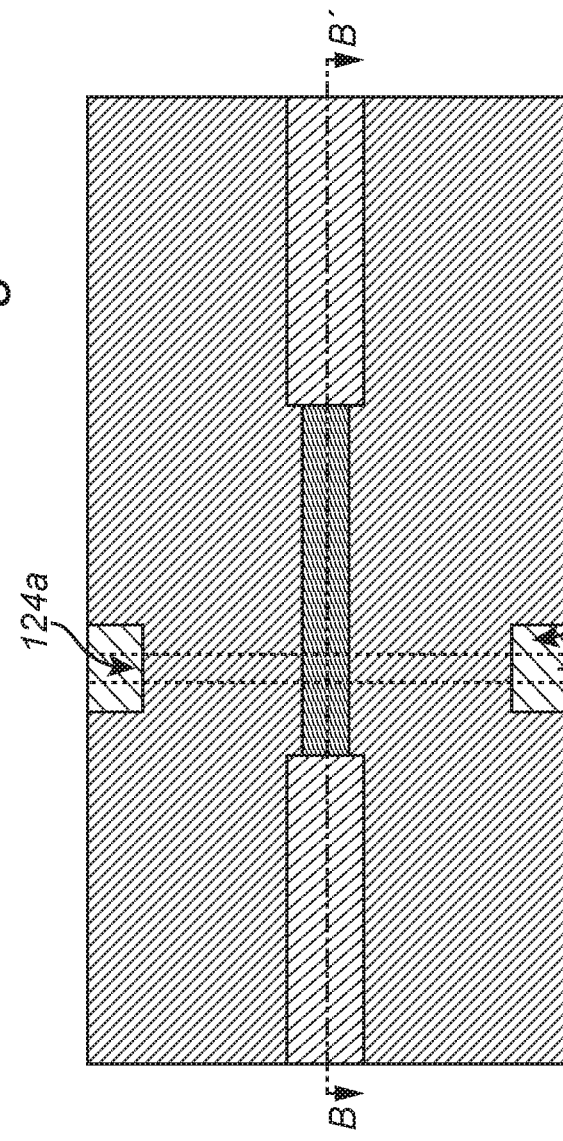
Fig. 12A
Fig. 12B

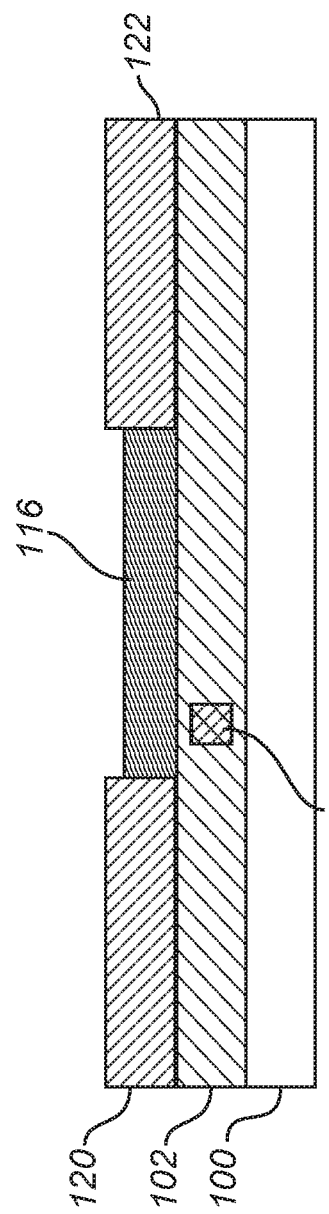
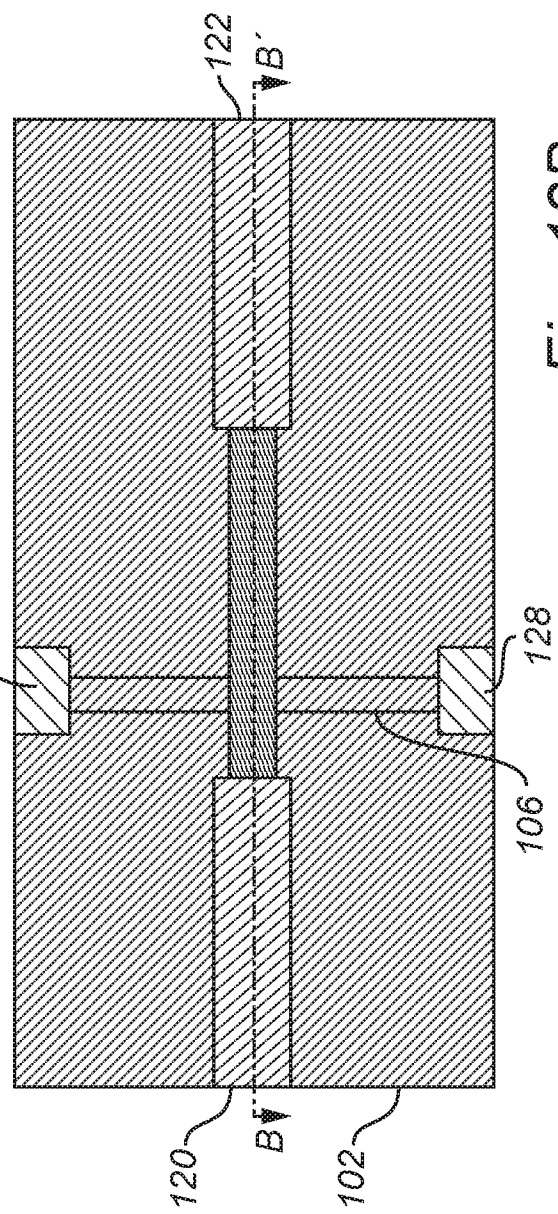

METHOD FOR FORMING A QUBIT DEVICE

CROSS-REFERENCE TO RELATED APPLICATIONS

This application claims foreign priority to European Application EP 17211120.5, filed on Dec. 29, 2017, which is incorporated herein by reference in its entirety.

BACKGROUND

Technological Field

The disclosed technology relates to a method of forming a qubit device. The disclosed technology further relates to a qubit device.

Description of the Related Technology

Quantum information science has the potential to radically improve existing techniques and devices for sensing, computation, simulation, and communication.

A major challenge in quantum information processing systems is to realize qubits with a sufficient degree of coherence while still allowing manipulation and measurements. One type of qubit device showing promise are devices based on so-called Majorana fermions. A Majorana fermion is its own antiparticle and may in a quantum mechanical framework be described as a superposition of an electron and a hole.

Although qubit devices based on Majorana fermions have been demonstrated on a lab-scale, realizing industrially viable and scalable qubit devices remains a challenge. Therefore, quantum information processing experiments are still expensive and time consuming endeavors. Existing laboratory setups may also be challenging to fine tune and scale.

SUMMARY OF CERTAIN INVENTIVE ASPECTS

An objective of the disclosed technology is to address the above-mentioned issues in the prior art. Further objectives may be understood from the following.

The disclosed technology provides a method of forming a qubit device. In one aspect, the method comprises: forming a gate electrode embedded in an insulating layer formed on a substrate, wherein an upper surface of the substrate is formed from a group IV semiconductor material and the gate electrode extends along the substrate in a first horizontal direction; forming an aperture in the insulating layer, the aperture exposing a portion of the substrate; forming, in an epitaxial growth process, a semiconductor structure comprising a group III-V semiconductor substrate contact part and a group III-V semiconductor disc part, the substrate contact part having a bottom portion abutting the portion of the substrate and an upper portion protruding from the aperture above an upper surface of the insulating layer, the semiconductor disc part extending from the upper portion of the substrate contact part, horizontally along the upper surface of the insulating layer to overlap a portion of the gate electrode; forming a mask covering a portion of the disc part, the portion of the disc part extending across the portion of the gate electrode in a second horizontal direction; etching regions of the semiconductor structure exposed by the mask such that the masked portion of the disc part remains to form a channel structure extending across the portion of the gate electrode; and forming a superconductor source contact and a superconductor drain contact to contact the channel structure at opposite sides of the portion of the gate electrode.

The disclosed technology enables accurate, repeatable and scalable manufacturing of qubit devices. The combination of a group III-V semiconductor channel structure and superconductor source and drain contacts enables Majorana fermion based qubit devices. As used herein, qubit device means a semiconductor device with a configuration such that, under the correct operating conditions, it may support or provide states or particles (or more specifically quasiparticles in the case of Majorana fermions) which may operate as qubits whose state may be manipulated and detected.

As the channel structure is formed by patterning an epitaxially grown group III-V material structure, the typical prior art approach of growing nanostructures (such as vertical nanowires) on a separate wafer and thereafter transferring them to a target substrate may be avoided. The method thereby allows an overall more efficient process as transfer of nanowires to intended positions at a target substrate may be delicate and difficult to scale.

Furthermore, the formation of the channel structure by patterning allows a considerable degree of control of the dimension, shape and arrangement of the channel structure in relation to the gate electrode.

By forming the gate electrode as an embedded gate electrode, exposure of the channel structure to the potentially adverse process conditions of gate electrode and gate dielectric formation may be avoided. Moreover, the embedded configuration of the gate electrode enables a gate-channel coupling of a strength suitable for qubit device operation to be achieved.

In terms of device properties, the method enables scalable fabrication of qubit devices with an improved uniformity in terms of structure and performance.

The superconductor source contact and the superconductor drain contact are preferably formed subsequent to forming the channel structure. More specifically, the method may comprise forming the superconductor source contact and the superconductor drain contact on the channel structure at opposite sides of the portion of the gate electrode. This facilitates achieving a proper alignment between the source/drain portions of the channel structure and the source/drain contacts.

By the upper surface of the substrate is intended a main surface of the substrate on which the processing according to the disclosed technology is performed. Hence, "upper" should not be construed to require a particular orientation of the substrate.

As used herein, the term first horizontal direction refers to a direction along the substrate, i.e. along the upper surface of the substrate. Correspondingly, the second horizontal direction refers to a direction along the substrate which is different from the first horizontal direction. The first and second horizontal directions may represent mutually perpendicular directions but may more generally extend at an angle with respect to each other. Accordingly, the term horizontal plane may be used to refer to a plane defined by the first and second horizontal directions. In other words, the term horizontal plane may denote a plane parallel to the upper (main) surface of the substrate.

A vertical direction may refer to a direction which is normal to the upper (main) surface of the substrate, or perpendicular to the first and second horizontal directions.

As used herein, a superconductor means any material exhibiting superconductivity when kept at a temperature below a critical temperature TC, specific to the material. By way of example, $T_C$ of Al is 1.20 K, $T_C$ of Ta is 4.48 K and $T_C$ of Ti is 0.39 K, $T_C$ of Nd is 9.26 K.

The mask may be formed such that the substrate contact part is exposed by the mask. Accordingly the substrate contact part may be removed during the etching wherein the channel structure is electrically insulated from the substrate by the insulator layer.

According to one embodiment, the formation of the gate electrode embedded in the insulating layer comprises: forming a first partial insulating layer on the upper surface of the substrate; forming a trench extending partially through the first partial insulating layer; forming the gate electrode in the trench; and covering the gate electrode and the first partial insulating layer with a second partial insulating layer, wherein the first partial insulating layer and the second partial insulating layer together form the insulating layer. As the trench is formed to extend only partially through the insulating layer, the gate electrode may be formed on an electrically insulating bottom surface of the trench.

The gate electrode may be formed to elongate in the first horizontal direction. An elongated gate electrode enables definition of a short gate-channel interface, along the direction of the channel. A highly localized gate control may thereby be achieved.

The method may further comprise forming a pair of gate contacts on the gate electrode, at opposite sides of the channel structure. Easy accessible electrical contact to the gate electrode may thereby be provided. In case the gate electrode is elongated, the contacts may be formed at a distance from the channel structure to mitigate undesired stray capacitive coupling between the contacts and the channel.

According to one embodiment, the gate electrode forms a first gate electrode and the method further comprises forming at least a second gate electrode, each one of the gate electrodes being embedded in the insulating layer and extending in the first direction. Providing more than one gate electrode enables improved channel control along the length of the channel structure.

The semiconductor disc part may be formed to overlap a respective portion of each one of the gate electrodes, wherein the channel structure may extend across each one of the portions of the gate electrodes. Gate electrode-channel structure overlap may thereby be obtained at plural positions in an efficient manner.

The epitaxial growth process may be adapted such that a growth rate in a horizontal plane is greater than a growth rate in a vertical direction during a part of the epitaxial growth process in which the disc part is grown. Thereby, a disc part having a greater horizontal dimension than vertical dimension may be grown. This in turn enables formation of a relatively long and thin channel structure.

The channel structure may be formed to elongate in the second horizontal direction. Combined with an epitaxial growth process promoting a horizontal plane growth rate a channel structure having a high length to thickness ratio and, optionally, a high width to thickness ratio may be achieved. Such a channel structure may be referred to as a nanowire.

The disc part may be formed to enclose the upper portion of the substrate contact part in a horizontal plane. The channel structure may hence be formed to extend on either side of the substrate contact part.

According to one embodiment, the formation of the source and drain superconductor contacts may comprise: forming a contact mask including a source contact opening exposing a source portion of the channel structure, and further including a drain contact opening exposing a drain portion of the channel structure; and forming the source superconductor contact in the source contact opening and the drain superconductor contact in the drain contact opening.

Superconductor contacts may thereby be conveniently formed wherein portions of the channel structure covered by the contact mask (i.e. portions other than the source portion and the drain portion) may be protected, at least to some extent, from the process conditions of the contact formation. The formation of the source and drain superconductor contacts in the respective mask openings may include deposition of a superconductor material in the respective openings. Optionally, a superconductor seed layer may be formed on portions of the channel structure exposed in the contact openings. This may improve an interface quality between the superconductor source/drain contacts and the channel structure.

The superconductor source contact and the superconductor drain contact may comprise Al, Ta, Ti, or Nd.

The epitaxial growth process may comprise growing the semiconductor structure of InSb, InAs, InGaAs, or InGaSb. These semiconductor materials, when used in combination with superconductor contacts, enable formation of Majorana fermions in the device channel.

Preferably, to enable improved device operation, at least the disc part may be formed from monocrystalline InSb, InAs, InGaAs, or InGaSb.

In another aspect, the disclosed technology provides a qubit device comprising: a gate electrode embedded in an insulating layer formed on a substrate, wherein an upper surface of the substrate is formed from a group IV semiconductor material and the gate electrode extends along the substrate in a first horizontal direction; a group III-V semiconductor channel structure extending horizontally, in a second horizontal direction, along an upper surface of the insulating layer and across a portion of the gate electrode; and a superconductor source contact and a superconductor drain contact formed on the channel structure at opposite sides of the portion of the gate electrode.

Further aspects of the disclosed technology provide a qubit device manufactured or obtained according to the methods of any of the above-described embodiments and variations thereof. These further aspects may generally present the same or corresponding advantages as the former methods.

BRIEF DESCRIPTION OF THE DRAWINGS

The above, as well as additional objectives, features, and advantages of the disclosed technology, will be better understood through the following illustrative and non-limiting detailed description, with reference to the appended drawings. In the drawings like reference numerals will be used for like elements unless stated otherwise.

FIG. 1A illustrates a cross-sectional side view of a semiconductor substrate. FIG. 1B illustrates a top down view of a semiconductor substrate.

FIG. 2A illustrates, in an embodiment of the disclosed method of forming a qubit device, a cross-sectional side view of a first partial insulating layer having been formed on the upper surface of the substrate. FIG. 2B illustrates, in an embodiment of the disclosed method of forming a qubit device, a top down view of a first partial insulating layer having been formed on the upper surface of the substrate.

FIG. 3A illustrates, in an embodiment of the disclosed method of forming a qubit device, a cross-sectional side view of a trench extending partially through the first partial insulating layer having been formed. FIG. 3B illustrates, in an embodiment of the disclosed method of forming a qubit device, a top down view of a trench extending partially through the first partial insulating layer having been formed.

FIG. 4A illustrates, in an embodiment of the disclosed method of forming a qubit device, a cross-sectional side view of a gate electrode having been formed in the trench. FIG. 4B illustrates, in an embodiment of the disclosed method of forming a qubit device, a top down view of a gate electrode having been formed in the trench.

FIG. 5A illustrates, in an embodiment of the disclosed method of forming a qubit device, a cross-sectional side view of the gate electrode and the first partial insulating layer having been covered by a second partial insulating layer. FIG. 5B illustrates, in an embodiment of the disclosed method of forming a qubit device, a top down view of the gate electrode and the first partial insulating layer having been covered by a second partial insulating layer.

FIG. 6A illustrates, in an embodiment of the disclosed method of forming a qubit device, a cross-sectional side view of an aperture having been formed in the insulating layer. FIG. 6B illustrates, in an embodiment of the disclosed method of forming a qubit device, a top down view of an aperture having been formed in the insulating layer.

FIG. 7A illustrates, in an embodiment of the disclosed method of forming a qubit device, a cross-sectional side view of a semiconductor structure having been formed in an epitaxial growth process to include a group III-V semiconductor substrate contact part and a group III-V semiconductor disc part. FIG. 7B illustrates, in an embodiment of the disclosed method of forming a qubit device, a top down view of a semiconductor structure having been formed in an epitaxial growth process to include a group III-V semiconductor substrate contact part and a group III-V semiconductor disc part.

FIG. 8A illustrates, in an embodiment of the disclosed method of forming a qubit device, a cross-sectional side view of a mask having been formed on the semiconductor structure. FIG. 8B illustrates, in an embodiment of the disclosed method of forming a qubit device, a top down view of a mask having been formed on the semiconductor structure.

FIG. 9A illustrates, in an embodiment of the disclosed method of forming a qubit device, a cross-sectional side view of the regions of the semiconductor structure exposed by the mask having been etched such that the masked portion of the disc part remains to form a channel structure. FIG. 9B illustrates, in an embodiment of the disclosed method of forming a qubit device, a top down view of the regions of the semiconductor structure exposed by the mask having been etched such that the masked portion of the disc part remains to form a channel structure.

FIG. 10A illustrates, in an embodiment of the disclosed method of forming a qubit device, a cross-sectional side view of a contact mask having been formed to cover the channel structure and the insulating layer. FIG. 10B illustrates, in an embodiment of the disclosed method of forming a qubit device, a top down view of a contact mask having been formed to cover the channel structure and the insulating layer.

FIG. 11A illustrates, in an embodiment of the disclosed method of forming a qubit device, a cross-sectional side view of a superconductor source contact and a superconductor drain contact having been formed on the channel structure, at opposite sides of the portion of the gate electrode. FIG. 11B illustrates, in an embodiment of the disclosed method of forming a qubit device, a top down view of a superconductor source contact and a superconductor drain contact having been formed on the channel structure, at opposite sides of the portion of the gate electrode.

FIG. 12A illustrates, in an embodiment of the disclosed method of forming a qubit device, a cross-sectional side view of a gate contact mask having been formed to cover the channel structure, the contacts and the insulating layer. FIG. 12B illustrates, in an embodiment of the disclosed method of forming a qubit device, a top down view of a gate contact mask having been formed to cover the channel structure, the contacts and the insulating layer.

FIG. 13A illustrates, in an embodiment of the disclosed method of forming a qubit device, a cross-sectional side view of a pair of gate contacts having been formed on opposite sides of the channel structure. FIG. 13B illustrates, in an embodiment of the disclosed method of forming a qubit device, a top down view of a pair of gate contacts having been formed on opposite sides of the channel structure.

DETAILED DESCRIPTION OF CERTAIN ILLUSTRATIVE EMBODIMENTS

Figure 14:
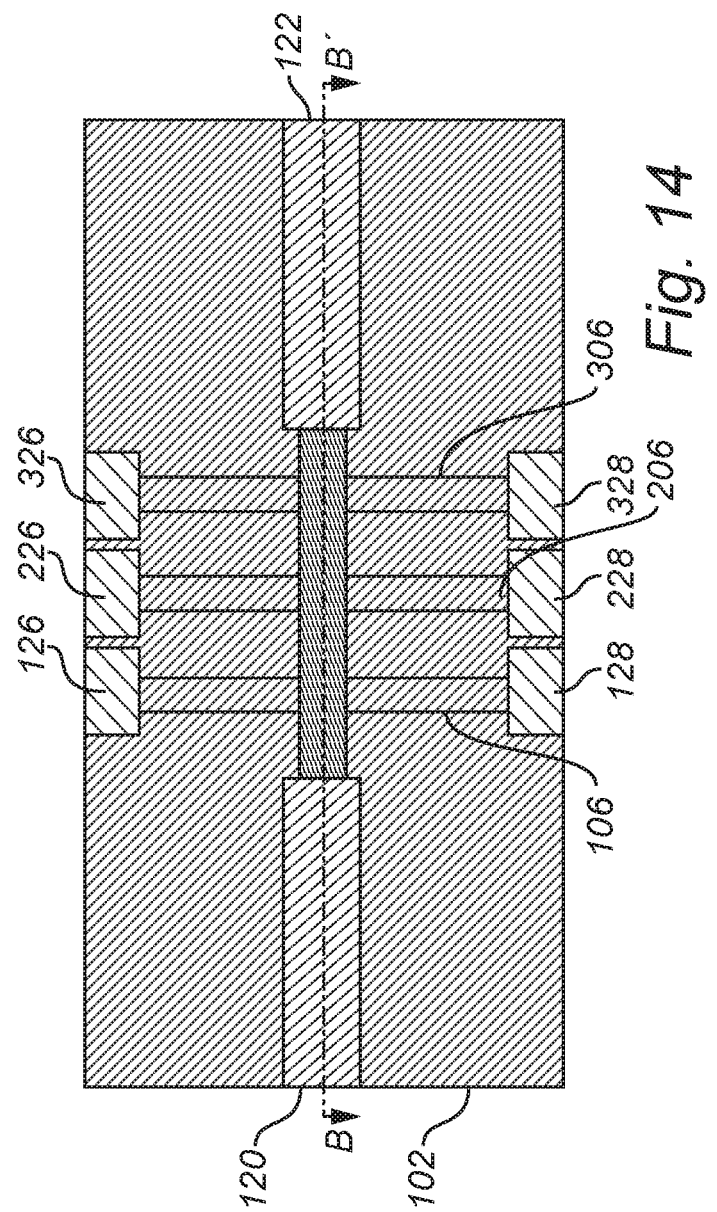
FIG. 14 schematically shows a variation of a qubit device.

A method of forming a qubit device will now be disclosed in connection with FIGS. 1-13. Each one of the figures shows a cross-sectional side view (FIGS. 1A-13A) of the structure and a top down view (FIGS. 1B-13B). The cross-sectional view in FIGS. 1A-13A is taken along the geometrical line indicated in the correspondingly numbered FIGS. 1B-13B (i.e. line AA' or BB'). In the figures the axis Z denotes a vertical direction, corresponding to a normal direction with respect to an upper surface 100a of a substrate 100. The axes X and Y refer to mutually orthogonal first and second horizontal directions, i.e. directions being parallel to the main plane of extension of the substrate 100 (or correspondingly the upper surface 100a thereof). It should be noted that the relative dimensions of the shown elements, such as the relative thickness of the layers of structures, is merely schematic and may, for the purpose of illustrational clarity, differ from a physical structure.

FIGS. 1A and 1B illustrate a semiconductor substrate 100. The semiconductor substrate 100 may be a single material substrate or formed with a combination of different materials, such as of various layers stacked on top of each other. In any case at least an upper surface 100a of the substrate 100 is formed from an elemental group IV semiconductor or compound group IV semiconductor. The upper surface may be formed from a [111] face of silicon (Si). Possible substrate 100 structures include a Si substrate or a silicon-on-insulator (SOI) substrate. The upper surface 100a of the substrate 100 may be referred to as a front side surface of the substrate 100.

In FIGS. 2A and 2B, a first partial insulating layer 102a has been formed on the upper surface 100a of the substrate 100. The first partial insulating layer 102a covers the upper surface 100a. The first partial insulating layer 102a may be an oxide layer, for instance, a silicon oxide such as $SiO_2$. The first partial insulating layer 102a may also be a dielectric layer, for instance, a high-K dielectric material such as aluminum oxide, or some other CMOS compatible gate dielectric. The first partial insulating layer 102a may be deposited on the surface 100a by any suitable and conventional deposition technique, such as chemical vapor deposition (CVD) or atomic layer deposition (ALD), or by thermal oxidation.

In FIGS. 3A and 3B, a trench 104 extending partially through the first partial insulating layer 102a has been formed. A longitudinal dimension of the trench 104 extends in the first horizontal direction X. A vertical dimension of the trench 104 extends in the vertical direction Z. As indicated in FIGS. 3A and 3B, a bottom surface of the trench 104 is formed of a remaining thickness portion of the first partial insulating layer 102a. A trench mask layer 103 has been formed on the first partial insulating layer 102a. A trench defining opening has been formed in the mask layer 103. The opening has subsequently been transferred into the first partial insulating layer 102a by etching of the material of the first partial insulating layer 102a to form the trench 104. The mask layer 103 may be a photoresist-based mask layer 103 of any other typical lithographic stack compatible with the material forming the first partial insulating layer 102a. Any conventional wet or dry etching process allowing etching of the material of the first partial insulating layer 102a may be employed. Subsequent to etching the trench 104, the mask layer 103 may be removed. The trench 104 may by way of example be formed with a width in the range of 20-100 nm, depending among others on the intended length of the final channel structure which is to be formed.

In FIGS. 4A and 4B, a gate electrode 106 has been formed in the trench 104. The gate electrode 106 is elongated and extends along the substrate upper surface, in the first horizontal direction X. The gate electrode 106 is electrically insulated from the substrate 100 by the insulating layer 102. A conductive gate electrode material may be deposited in the trench 104. The conductive gate electrode material may be a metal or a metal alloy. However other gate electrode materials are also possible, such as polysilicon. The material may be deposited by any conventional deposition technique, such as by ALD, CVD, or physical vapor deposition (PVD). The material may be deposited to fill the trench 104 and cover the first partial insulating layer 102a. Overburden gate electrode material (i.e. material portions deposited outside of the trench 104) may subsequently be removed from outside of the trench by chemical mechanical polishing (CMP) and/or an etch back process, thereby exposing an upper surface of the insulating layer 102a.

In FIGS. 5A and 5B, the gate electrode 106 and the first partial insulating layer 102a has been covered by a second partial insulating layer 102b. The first partial insulating layer 102a and the second partial insulating layer 102b together form a compound insulating layer, hereinafter referred to as the insulating layer 102, embedding the gate electrode 106. The second partial insulating layer 102b may be formed from a same material as the first partial insulating layer 102a. The second partial insulating layer 102b may be deposited in a similar manner as the first partial insulating layer 102a. A total thickness of the insulating layer 102 may, for instance, be in the range of 10-50 nm.

In FIGS. 6A and 6B, an aperture 108 has been formed in the insulating layer 102. The aperture 108 exposes an upper surface portion 100b (i.e. a portion of the upper surface 100a) of the substrate 100. The aperture 108 extends vertically through the insulating layer 102. An aperture mask layer 107 has been formed on the insulating layer 102. An aperture defining opening has been formed in the mask layer 107. The opening has subsequently been transferred into the insulating layer 102 by etching of the material (of the insulating layer 102 to form the aperture 108. The mask layer 107 may be a photoresist-based mask layer 107 of any other typical lithographic stack compatible with the material forming the first partial insulating layer 102a. Any conventional wet or dry etching process allowing etching of the material of the insulating layer 102 may be employed. Subsequent to etching the aperture 108 the mask layer 107 may be removed.

In FIGS. 7A and 7B, a semiconductor structure 110 has been formed in an epitaxial growth process to include a group III-V semiconductor substrate contact part 112 and a group III-V semiconductor disc part 114. The substrate contact part 112 is formed in the aperture 108. The disc part 114 is formed above the insulating layer 102. The substrate contact part 112 has a bottom portion, 112a, abutting the upper surface portion 100b. The substrate contact part 112 has an upper portion 112b protruding from the aperture 108 above an upper surface 102c of the insulating layer 102. The disc part 114 extends from the upper portion 112b of the substrate contact part 112, horizontally or laterally along the upper surface 102c (i.e. in the horizontal plane defined by the axes X and Y). The disc part 114 is accordingly formed to enclose the upper portion 112b of the substrate contact part 112 in a horizontal plane, or in other words, enclose in a circumferential direction with respect to the substrate contact part 112. As may be seen in FIGS. 7A and 7B, a horizontal extension of the disc part 114 is such that the disc part 114 overlaps a portion 106a of the gate electrode 106. The semiconductor structure 110 may be formed by vapor phase epitaxy.

It should be noted that the particular polygonal shape of the disc part 114 illustrated in FIG. 7B merely is one example and that other shapes, such as generally hexagonal shapes, are also possible. The specific shape typically may depend on the growth conditions and the orientation of the growth surfaces.

A semiconductor structure 110 of any one of InSb, InAs, InGaAs, or InGaSb may be epitaxially grown. The process conditions of the epitaxial process may be controlled such that at least the disc part 114 is formed from monocrystalline material, for instance, monocrystalline InSb, InAs, InGaAs, or InGaSb. However, it may also be possible to use other materials with a sufficiently large Lande G-factor.

The epitaxial growth process may be adapted such that, for the group III-V semiconductor disc part 114, a growth rate in a horizontal plane (i.e. along the first and second horizontal directions X and Y) is greater than a growth rate in a vertical direction Z. The lateral/horizontal growth rate may, for instance, be (at least) a factor 10 greater than the vertical growth rate. This may be implemented during at least a part of the epitaxial growth process in which the disc part 114 is grown. However, as the lateral growth inside the aperture 108 will be limited by the lateral dimensions of the aperture 108 a lateral growth may be promoted throughout the epitaxial growth of the full semiconductor structure 110.

For instance, a lateral growth of a group III-V semiconductor material may be obtained by controlling a growth temperature to be in the range of 500° C. to 650° C. A total pressure (in the growth chamber) may be in the range of 20 mbar to 150 mbar. The process conditions during the growth may be controlled such that a lateral growth rate in the range of 1 nm/s to 5 nm/s, and a vertical growth rate in or below the range 0.1 nm/s to 0.5 nm/s is obtained.

In FIGS. 8A and 8B, a mask 115 has been formed on the semiconductor structure 110. The mask 115 may be referred to as the channel structure mask 115. The mask 115 covers a portion of the disc part 114. The masked portion may be formed as an elongated portion of the disc part 114, extending in the second horizontal direction Y. The portion (as well as the mask 115) includes a sub-portion 114a extending across the portion 106a of the gate electrode 106. The mask 115, as shown in FIG. 9B, may be formed to expose the substrate contact part 112. The mask 115 may be formed by depositing a mask layer on the semiconductor structure 110, such as a photoresist-based mask layer or any other typical lithographic stack compatible with the material of the semiconductor structure 110. The mask 115 may subsequently be defined by patterning the mask layer using a conventional patterning technique.

In FIGS. 9A and 9B, the regions of the semiconductor structure 110 exposed by the mask 115 have been etched such that the masked portion of the disc part 114 remains to form a channel structure 116. As shown in FIGS. 9A and 9B, the channel structure 116 includes a portion 116a extending across the portion 106a of the gate electrode 106. The channel structure 116 extends along the upper surface of the insulating layer 102 to elongate in the second horizontal direction Y. As the mask 115 exposed the substrate contact part 112 the channel structure 116 is after completion of the etching disconnected from the substrate 100. Any remaining hole in the insulating layer 102 (i.e. the hole previously exposing the portion 100b and accommodating the substrate contact part 112) may, for instance, be filled by an insulating material subsequent to the etch. The semiconductor structure 110 may be etched using any conventional dry etching process allowing etching of the material of the semiconductor structure 110, such as a reactive ion etch (RIE) or ion beam etch (IBE). Subsequent to forming the channel structure 116, the mask 115 may be removed.

In FIGS. 10A and 10B, a contact mask 118 (i.e. a source/drain contact mask 118) has been formed to cover the channel structure 116 and the insulating layer 102. The contact mask 118 may, for instance, be a photoresist-based mask or an electron beam resist-based mask (e.g. a PMMA mask). A source contact opening 118s exposing a source portion 116s of the channel structure 116 has been defined in the mask 118. Further, a drain contact opening 118d exposing a drain portion 116d of the channel structure 116 has been defined in the mask 118.

In FIGS. 11A and 11B, a superconductor source contact 120 and a superconductor drain contact 122 have been formed on the channel structure 116, at opposite sides of the portion 106b of the gate electrode 106. A superconductor has been deposited in the source contact opening 118s and in the drain contact opening 118d. For instance, Al, Ta, Nd, or Ti may be deposited by CVD, ALD, or PVD. The superconductor may be deposited to fill the openings 118s and 118d and cover the contact mask 118. Overburden superconductor material may subsequently be removed from outside of the trench by CMP and/or an etch back process, thereby exposing an upper surface of the contact mask 118. The contact mask 118 may subsequently wherein the contacts 120, 122 may remain on the channel structure 116. Optionally, the deposition of the superconductor in the contact openings 118s and 118d may be preceded by deposition of a superconductor seed layer (e.g. by selective area epitaxy) on portions of the channel structure 116 exposed in the contact openings 118s and 118d.

In FIGS. 12A and 12B, a gate contact mask 124 has been formed to cover the channel structure 116, the contacts 120, 122 and the insulating layer 102. The gate contact mask 124 may, for instance, be a photoresist-based mask or an electron beam resist-based mask (e.g. a PMMA mask). A pair of gate contact openings 124a and 124b have been defined in the mask 124, exposing respective portions of the insulating layer directly above the gate electrode 106.

In FIGS. 13A and 13B, a pair of gate contacts 126 and 128 have been formed on opposite sides of the channel structure 116. The gate contact openings 124a and 124b have been transferred into the insulating layer 102 to form a pair of gate contact holes in the insulating layer 102. The gate contact holes have subsequently been filled with a conductive contact material, for instance, a metal such as a suitable CMOS-compatible metal contact material. The contact material may be deposited by CVD, ALD, or PVD, for instance. Overburden contact material may subsequently be removed from outside of the gate contact holes by CMP and/or an etch back process, thereby exposing an upper surface of the gate contact mask 124. The mask 124 has subsequently been removed wherein the contacts 126, 128 remain on the gate electrode 106.

The resulting device has a configuration which makes it suitable for use as a qubit device which, under the correct operating conditions as is known in the art, enables formation of Majorana fermions and conduction of the same along the channel structure 116 between the superconductor source and drain electrodes 120 and 122. The configuration of the gate electrode 106 allows a chemical potential in the nanostructure 116 to be adapted to enable the Majorana fermions, i.e. qubits, to be manipulated. Preferably, a plurality of such qubit may be formed on the substrate 100 and interconnected to each other to implement qubit logic gates.

In the above the disclosed technology has mainly been described with reference to a limited number of examples. However, as is readily appreciated by a person skilled in the art, other examples than the ones disclosed above are equally possible within the scope of the disclosed technology, as defined by the appended claims.

For instance, it is possible to form more than one, such as two or more, channel structures simultaneously from the disc part 114. The channel structures may be formed to extend across a respective portion 106a of the gate electrode 106. The channel structures may be formed to extend in parallel to each other. More than one channel structure may be formed by patterning the channel structure mask (corresponding to mask 115 above) to include a number of discrete mask portions, each defining a respective channel structure.

According to a further variation, FIG. 14 illustrates a qubit device wherein additional embedded gate electrodes, 206 and 306, parallel to the gate electrode 106, have been formed along the channel structure 116. A respective further pair of gate contacts 226, 228 and 326, 328 have been formed on the gate contacts 206, 306. The further gate electrodes 206, 306 may be formed by forming further trenches parallel to the trench 104, as disclosed in connection with FIGS. 3A and 3B. The three gate electrodes in FIG. 14 represents merely one example, while a qubit device may be formed to include any number of embedded gate electrodes along the channel structure 116.

What is claimed is:

1. A method of forming a qubit device, the method comprising:
forming a gate electrode embedded in an insulating layer formed on a substrate, wherein an upper surface of the substrate is formed from a group IV semiconductor material and the gate electrode extends along the substrate in a first horizontal direction;
forming an aperture in the insulating layer, the aperture exposing a portion of the substrate;
forming, in an epitaxial growth process, a semiconductor structure comprising a group III-V semiconductor substrate contact part and a group III-V semiconductor disc part, the substrate contact part having a bottom portion abutting the portion of the substrate and an upper portion protruding from the aperture above an upper surface of the insulating layer, and the semiconductor disc part extending from the upper portion of the substrate contact part, horizontally along the upper surface of the insulating layer to overlap a portion of the gate electrode;

forming a mask covering a portion of the disc part, the portion of the disc part extending across the portion of the gate electrode in a second horizontal direction;

etching regions of the semiconductor structure exposed by the mask such that the masked portion of the disc part remains to form a channel structure extending across the portion of the gate electrode; and forming a superconductor source contact and a superconductor drain contact on the channel structure at opposite sides of the portion of the gate electrode.

2. The method according to claim 1, wherein the substrate contact part is exposed by the mask.

3. The method according to claim 1, wherein the formation of the gate electrode embedded in the insulating layer comprises:

forming a first partial insulating layer on the upper surface of the substrate;

forming a trench extending partially through the first partial insulating layer;

forming the gate electrode in the trench; and covering the gate electrode and the first partial insulating layer with a second partial insulating layer, wherein the first partial insulating layer and the second partial insulating layer together form the insulating layer.

4. The method according to claim 1, further comprising forming a pair of gate contacts on the gate electrode, at opposite sides of the channel structure.

5. The method according to claim 1, wherein the gate electrode is formed to elongate in the first horizontal direction.

6. The method according to claim 1, wherein the gate electrode serves as a first gate electrode and the method further comprises forming at least a second gate electrode, each gate electrode being embedded in the insulating layer and extending in the first horizontal direction.

7. The method according to claim 6, wherein the semiconductor disc part is formed to overlap a respective portion of each one of the gate electrodes, and the channel structure extends across each one of the portions of the gate electrodes.

8. The method according to claim 1, wherein the epitaxial growth process is adapted such that a growth rate in a horizontal plane is greater than a growth rate in a vertical direction during a part of the epitaxial growth process in which the disc part is grown.

9. The method according to claim 1, wherein the channel structure is formed to elongate in the second horizontal direction.

10. The method according to claim 1, wherein the disc part is formed to enclose the upper portion of the substrate contact part in a horizontal plane.

11. The method according to claim 1, wherein the formation of the source and drain superconductor contacts comprises:

forming a contact mask having a source contact opening exposing a source portion of the channel structure, and further having a drain contact opening exposing a drain portion of the channel structure; and forming the source superconductor contact in the source contact opening and the drain superconductor contact in the drain contact opening.

12. The method according to claim 1, wherein the superconductor source contact and the superconductor drain contact are formed of a material comprising Al, Ta, Ti, or Nd.

13. The method according to claim 1, wherein the epitaxial growth process comprises growing the semiconductor structure of InSb, InAs, InGaAs, or InGaSb.

14. The method according to claim 13, wherein at least the disc part is formed from monocrystalline InSb, InAs, InGaAs, or InGaSb.

* * * * *